United States Patent [19]

Douglas et al.

[11] Patent Number: 4,799,190
[45] Date of Patent: Jan. 17, 1989

[54] DATA SELECTION CIRCUITS, SYSTEMS AND METHODS

[75] Inventors: Joseph Douglas, Belper; Richard P. Jennings, Marlborough, both of England

[73] Assignee: ROLLS-ROYCE plc, London, England

[21] Appl. No.: 6,342

[22] Filed: Jan. 21, 1987

Related U.S. Application Data

[63] Continuation of Ser. No. 777,572, Sep. 19, 1985, abandoned, which is a continuation of Ser. No. 139,276, Apr. 10, 1980, abandoned, which is a continuation of Ser. No. 847,803, Nov. 2, 1977, abandoned.

[30] Foreign Application Priority Data

Nov. 12, 1976 [GB] United Kingdom ............... 47154/76

[51] Int. Cl.⁴ .................................................. G06F 07/02
[52] U.S. Cl. ................................... 364/900; 374/104; 364/769; 324/103 R; 377/39
[58] Field of Search ............... 364/414, 415, 557, 769; 356/43, 45; 374/104, 111, 144, 128, 170, 121; 324/103 R; 377/39

[56] References Cited

U.S. PATENT DOCUMENTS

| | | | |
|---|---|---|---|
| 3,463,007 | 8/1969 | Jones et al. | 73/355 R |
| 3,526,135 | 9/1970 | Wortz | 73/355 R |
| 3,562,708 | 2/1971 | Verbarg et al. | 340/146.1 R |
| 3,574,282 | 4/1971 | Curwen | 374/113 |
| 3,635,085 | 1/1972 | Shimotsuma et al. | 73/355 R |
| 3,689,921 | 9/1972 | Berry | 343/8 |
| 3,719,071 | 3/1973 | Hohenberg | 374/111 |
| 3,863,215 | 1/1975 | McGrogan Jr. | 340/146.1 BA |
| 3,872,649 | 11/1973 | Haselwood et al. | 364/146.1 BA |
| 3,924,078 | 12/1975 | Bussey | 364/769 |
| 3,973,242 | 8/1976 | Field et al. | 340/146.1 BA |
| 4,015,476 | 4/1977 | Roche et al. | 374/104 |
| 4,027,291 | 5/1977 | Torura et al. | 369/200 |
| 4,095,283 | 6/1978 | Campbell et al. | 364/200 |

OTHER PUBLICATIONS

Donovan, System Programming text book, pp. 84–91, McGraw Hill, 1972.

"Digital Peak Detecting and Ripple Testing Device", by Chambers, IBM TECH. Discl. Bull., vol. 17, No. 7, Dec. 74, pp. 1869–1870.

"High Speed Optical Pyrometer", by Foley, The Review of Scientific Instrument, vol. 41, No. 6, Jun. 70, pp. 827–834.

Primary Examiner—Eddie P. Chan
Attorney, Agent, or Firm—Cushman, Darby & Cushman

[57] ABSTRACT

Data processing methods and circuit arrangements are provided whereby out of a succession of data, some or most of which are false due to interference or noise, only those most likely to be true are selected for transmission to following stages of processing. Selection is achieved by comparing, according to a predetermined criterion, successive input data words with a data word already held in a data store and updating the store by discarding the stored data word and replacing it with an input data word whenever an input data word meets the predetermined criterion. A stored data word is utilised in further processing only when a predetermined number of input data words have been compared with the stored data word without updating having occurred. The invention has particular relevance to optical pyrometry systems.

3 Claims, 1 Drawing Sheet

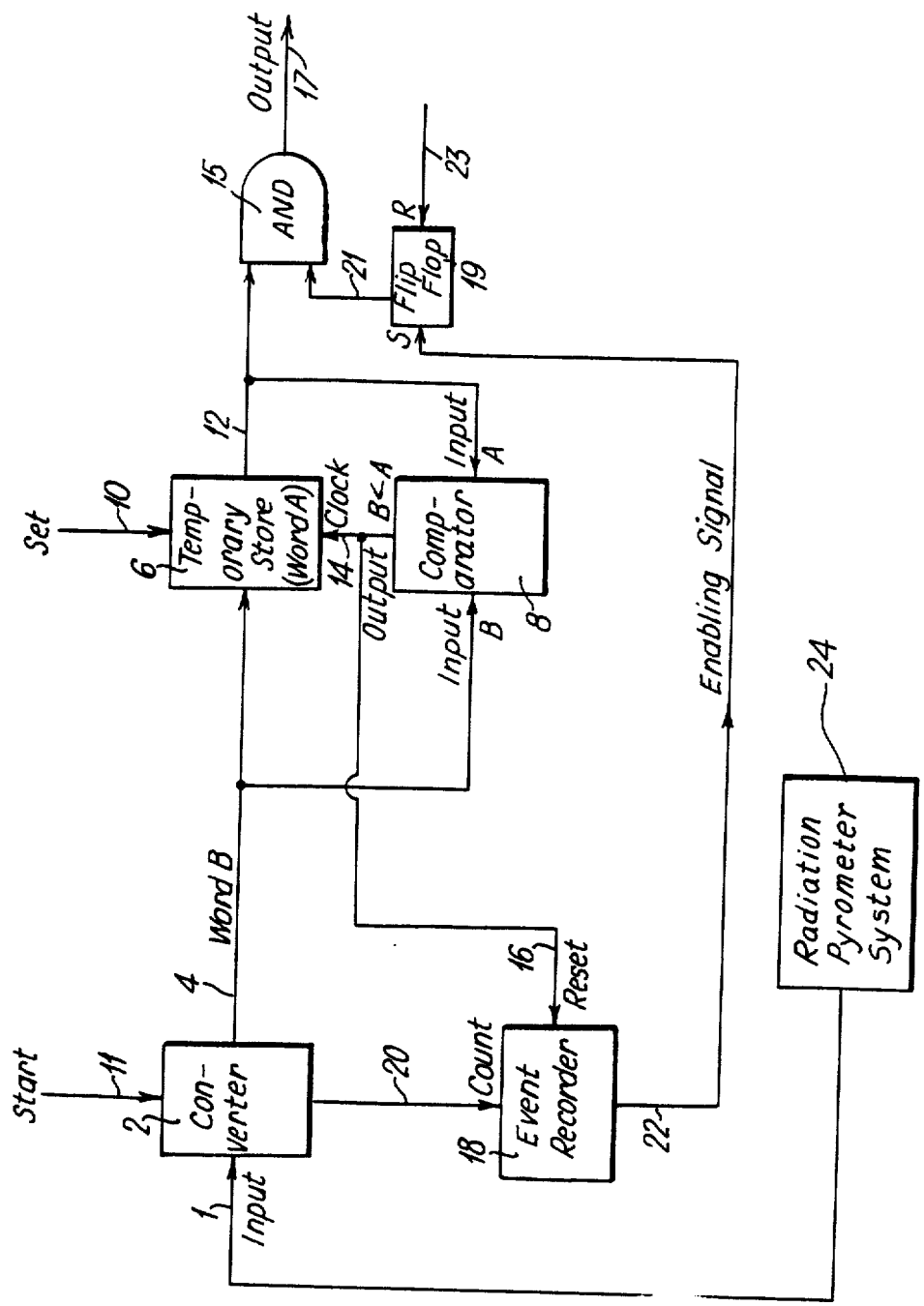

DATA SELECTION CIRCUITS, SYSTEMS AND METHODS

This is a continuation of application Ser. No. 772,572, filed Apr. 8, 1980, which was abandoned upon the filing hereof, which is a continuation of 139,276, filed Apr. 10, 1980, now abandoned, which is in turn a continuation of 847,803, filed Nov. 2, 1977, now abandoned.

This invention relates to data processing methods or systems for selecting data according to certain criteria. They may be used, for example, to improve the accuracy of radiance measurements made by means of radiation pyrometers.

In British Patent Specification No. 1 411 285 there is described and claimed an optical radiation pyrometer system which is capable of measuring the radiance of an object or a particular part of an object as it moves rapidly through the field of view of the pyrometer. The radiance measurements are of course related to the temperature of the object. The system is particularly suitable for use in deriving the temperature of an object or part of an object which moves repetitively through the field of view, such as a turbine blade on a rotor in a gas turbine. By sychronising the operating of the pyrometer system with the revolutions of the rotor, as mentioned in the abovementioned specification, the pyrometer can be made to "look" at any chosen blade, or part of a blade, on a "once per revolution" basis, somewhat in the manner of a stroboscope. The output from the system thus consists of a series of radiance measurements from the same location on the rotor. By altering the synchronism between rotor revolutions and the operation of the pyrometer such that the pyrometer receives radiation from a different sample area on the same or a different blade, the pyrometer can be made to "scan" around the rotor so that radiance profiles (and hence temperature profiles) of blades can be monitored whilst the gas turbine is in operation. Also, any particular blade or sample area on it can be chosen for inspection.

A difficulty in accurately interpreting these measurements arises in the fact that the strength of the pyrometer signal during each "look" at a blade may be partly attributable to sources of interference. For example, when turbine blades immediately downstream of a combustor are being examined, sources of interference include reflected radiation from the combustor and radiation from the gas stream as it passes through the field of view of the pyrometer. In the latter case discrete burning droplets of fuel or tongues of flame may be seen.

It is thus desirable to eliminate from subsequent data processing those signals which do not represent true blade radiances, and this is achieved in the present invention by automatically selecting those signals having the lowest value. However, automatic selection of those signals having the highest value is also within the scope of the present invention, and this has application to other data selection problems, as mentioned later in this specification.

SHORT STATEMENT OF THE INVENTION

According to one aspect of the present invention, a method of data processing comprises:

(a) comparing, according to a predetermined criterion, successive data words with a data word previously stored in data storage means;

(b) updating the data in the data storage means by discarding the stored data word and replacing it with another data word only when that other data word meets the predetermined criterion;

(c) utilising the stored data word only when a predetermined number of data words have been compared with the stored data word without updating having ocurred. The predetermined criterion may be, for example, that the data word being compared with the stored data word must be of less value than the stored data word. On the other hand, for example, the predetermined criterion may alternatively be that the data word being compared with the stored data word must be of greater value than the stored data word.

The invention includes a data processing system or subsystem using any one of the above mentioned methods of data processing. The invention also includes a radiation pyrometry system in which data relating to radiance measurements are processed using any one of the above methods of data processing.

According to another aspect of the present invention, a circuit arrangement for selecting data according to a predetermined criterion comprises:

(a) data input means arranged and constructed to inject input data words into said circuit arrangement and emit a count signal for each input data word so injected;

(b) data storage means settable to an initial state representing an initially stored data word of desired value, connected to receive the input data words, and having an up-date facility whereby according to said predetermined criterion comparison is made between the value of the data word already in storage and the value of each input data word, the stored data word being discarded and replaced by the input data word under comparison when said criterion is met, a commond signal being emitted from the data storage means each time the up-date facility operates;

(c) resettable counter means connected to receive the count and command signals and adapted to totalise the count signals but be reset to zero on receipt of each command signal and emit an enabling signal when a predetermined number of count signals have been received without receipt of a command signal: and (d) data output means connected and constructed to allow the stored data word to pass therethrough only upon receipt of an enabling signal.

The up-date facility may, for example, be arranged to perform comparisons in accordance with a criterion which states that the input data word must be of less value than the stored data word. On the other hand, for example, the up-date facility may alternatively be arranged to perform comparisons in accordance with a criterion which states that the input data word must be of greater value than the stored data word.

The up-date facility of the data storage means can be achieved by including within the data storage means a data store and a comparator circuit connected across the data store, the comparator circuit being adapted to emit the command signal each time the predetermined criterion is met, the data store being connected to receive the command signals and adapted to allow entry of the input data word upon receipt of a command signal.

The data input means can include an analogue-to-digital converter, whereby input analogue signals can be accepted and converted to corresponding data words for injection into said circuit arrangement.

Preferably, the data output means comprise an AND gate for gating data from the data storage means and a flip-flop connected between the AND gate and the resettable counter means, whereby the AND gate is enabled to allow passage of data therethrough only when the flip-flop is SET by receipt of an enabling signal from the resettable counter means.

The circuit arrangement may be further described as comprising;

(a) an analogue-to-digital converter for receiving input analogue signals and injecting corresponding input data words into said circuit arrangement, (b) a temporary data store for allowing controlled entry thereinto of input data words from said analogue-to-digital converter and being settable to an initial state representing an initially stored data word of predetermined value, (c) a comparator circuit associated with said temporary data store for controlling entry of input data words into said temporary data store, (d) an AND gate for gating output of data from said temporary data store thereby to control output of data from said circuit arrangement, (e) a flip-flop associated with said AND gate for enabling said AND gate to pass data from said temporary data store when said flip-flop is in the SET state, and (f) a resettable counter circuit for counting the number of input data words injected into said circuit arrangement and for controlling the operation of said AND gate by means of said flip-flop;

wherein, during operation of said circuit arrangement, said comparator circuit controls entry of input data words into said temporary data store by comparing, according to said predetermined criterion, the value of each said input data word with the value of the data word already stored in said temporary data store and, if the value of an input data word meets said criterion, causing said temporary data store to discard said stored data word and replace the same with said input data word, and said resettable counter circuit if RESET to zero each time the data in said temporary data store is changed and controls operation of said AND gate by putting said flip-flop into the SET state whenever said counter circuit counts the injection of a predetermined number of said input data words without being RESET.

The comparator circuit can, for example, be arranged to perform comparisons in accordance with the criteria specifically stated previously.

The invention includes radiation pyrometry systems incorporating the circuit arrangements described above.

BRIEF DESCRIPTION OF THE DRAWINGS

Embodiments of the invention will now be described, by way of example only. The accompanying drawing is a block diagram showing a digital data selection circuit arrangement according to the invention.

DETAILED DESCRIPTION OF THE PREFERRED EMBODIMENT

It is known that analogue signals arriving via input line 1 represent the value of a particular parameter of a system which is being studied, plus a random component due to interference or "noise". It is also known that the random component is likely to vary from a value of zero upwards. The data selection circuit allows only those signals which are likely to represent the true value of the parameter being studied to pass through it.

Briefly, the data selection circuit works as follows: an incoming analogue signal in input line 1, being one of a series of such signals, is converted to a digital signal in analogue-to-digital converter 2, passed simultaneously to temorary store 6 and to the comparator 8 connected across it, and stored in temporary store 6 only if comparator 8 detects that it is of less value than data already in the store. The output line 17 of the selection circuit is gated by AND gate 15, which only allows data in the temporary store 6 to appear in output line 17 when enabled by a pulse from flip-flop 19 caused as it is put into the SET state by an enabling signal from event recorder 18. The enabling signal indicates that a predetermined number of signals have been passed to temporary store 6 without replacement of data in the store having occurred.

The selection circuit will now be described more fully.

When it is desired to commence processing of a series of signals appearing in line 1, the data selection circuit is put into an operative state by a "start" signal in line 11 which causes the eight-bit analogue-to-digital converter 2 to start converting each successive analogue signal into a corresponding eight-bit digital word. At the same time, the eightbit temporary store 6 is set to its "logical 1" state, i.e. its full capacity, by an appropriate input on line 10. This provides an initial reference value, here called "Word A", for comparison according to a predetermined criterion with the incoming data words on line 4, one of which is designated as "Word". The comparison of Word A with Word B takes place in comparator circuit 8, which controls entry of data into the temporary store 6 according to the predetermined criterion. When the criterion is met, comparator circuit 8 causes the temporary store 6 to discard the data word already stored and replace it with the input data word under comparison. Thus, the comparator circuit 8 provides the data store 6 with an up-date facility. In this example, the predetermined criterion which must be met before the up-date facility operates is that the input data word (Word B) must be of lesser value than the stored data word (Word A).

During the comparison and up-dating operations, Word B is passed simultaneously via line 4 to temporary store 6 and input B of comparator 8, whose input A is connected to the output side 12 of temporary store 6. Word A is therefore available for comparison with Word B in comparator 8, which is adapted to emit a command pulse to temporary store 6 on command like 14 only if it senses that Word B is of less value than Word A. The receipt of such a command pulse by temporary store 6 causes Word A to be discarded and Word B to be registered instead.

AND gate 15 is normally in the "O" state and in this state acts to prevent data in temporary store 6 from appearing in the output line 17. Gate 15 is connected to the output of a flip-flop 19 via line 21 and when the flip-flop 19 is put into the SET condition by an enabling pulse on line 22 from event recorder 18, it emits a pulse on line 21 which enables gate 15. The data in th tempo- rary store is thus allowed to appear in the output line 17 whilst the flip-flop 19 is in the SET condition. The flip-flop 19 is RESET by a pulse on line 23 occurring at the same time as the pulse on line 10 which sets the temporary store 6, and the resulting output pulse on line 21 puts the gate 15 back into the 'O' state.

Event recorder 18 is a resettable counting circuit which is controlled by converter 2 via line 20 and comparator 8 via command link 16. Converter 2 is adapted to give a count signal on line 20 each time it converts, and this causes the event recorder 18 to count "one" each time it receives a count signal. The count is cumulative, but each time the data in the data store 6 is updated when the comparator 8 emits a command pulse via command links 14 and 16, the event recorder 18 is reset to zero, i.e. it is reset when the data in temporary store 6 is changed. The event recorder 18 is adapted to emit the enabling pulse on line 22 whenever it has counted up to a predetermined number (say, twelve) without being reset. In effect, this indicates that the data selection circuit has selected and stored in temporary store 6 the digital word having the lowest value out of a series of such digital words, and this word is thus allowed to appear in output line 17. It corresponds to the analogue signal of lowest value received at input 1 during the period of operation of the data selection circuit.

The above described circuit may advantageously by incorporated in a radiation pyrometry system used to monitor rotor blade radiances in gas turbines. A suitable basic system is described in the acknowledged prior art. In such a case, the converter 2 could receive a signal from the pyrometer on line 1 once per revolution of the rotor. By means of the data selection circuit, a designated location on a designated blade on the rotor is examined once per revolution of the rotor for a number of revoultions sufficient to allow data selection. The selected data word representing the pyrometer radiance signal of least value is passed to a large data store (not shown) via output line 17. Another location on the same or another blade can then be examined, and the data similarly selected and passed to the large data store. Information received from the pyrometer in this way may be stored in the large store by giving each selected data word an "address" in terms of the particular blade and the particular area on that blade to which it relates. Accurate data relating to any monitored area of any blade on the rotor can thus be recalled and displayed, for example on an oscilloscope. Utilising the radiance data, a complete and accurate temperature profile of any blade or series of blades can thus be assembled as required, whilst the gas turbine is in operation.

Although the data selection circuit has been discribed as a means for automatically selecting a signal of minimum value from a series of signals, it will be readily apparent to one skilled in the art that it could be used to select a signal of maximum value from a series of signals, since if comparator 8 were to be connected across temporary store 6 in the opposite sense, it would cause data in the temporary store 6 to be discarded in favour of data having greater value, the temporary store 6 being of course initially set to its "logical O" state.

One application for which automatic selection of signals having the highest value would be useful is, for instance, determination of the maximum temperatures of radiant particles in a hot gas stream.

Embodiments of the invention have been described as comprising discrete but interconnected digital circuit components. The detailed functioning of these components and the elements from which they are constructed have not been described because they are well known to those skilled in the art.

It will also be realised that data selection circuits according to the invention could be incorporated on a single microprocessor chip if so desired, or produced by connecting together a plurality of "off-the-shelf" microprocessors (possessing the necessary storage, comparison and counting facilities) in an appropriate way.

Further, it should be understood that the methods of the invention are not limited to performance on circuit arrangements comprising permanently interconnected components and elements as hereinbefore described. For example, data selection methods according to the invention can be performed on an appropriately programmed computer, and our invention therefore embraces a computor programmed to select data according to the methods of the invention.

I claim:

1. A radiation pyrometer system for measuring a radiance of at least a portion of an object moving repetitively through a field of view comprising:

means for detecting the radiance from at least a portion of said object as said object repetitively moves through said field of view;

means for converting said detected radiance to a series of data words, each of said data words representing the value of said detected radiance at a given time;

a temporary data store communicating with said converting means for storing said data words and being resettable to an initial state representing an initially stored data word of predetermined value, said temporary data store having an input and an output;

a controlling means communicating with the input and output of said temporary data store for controlling entry of input data words into said temporary data store from said converting means, said controlling means receiving from the output of said temporary data store the data word stored thereby, receiving from the input of said temporary data store each of said input data words and comparing, according to a predetermined criterion, the value of each input word with the value of the data words stored in said temporary data store and if the value of an input data word meets said criterion, said controlling means outputting a control signal to said temporary data store to cause said temporary data store to discard said stored data word and replace same with said input data word, said criterion being that said input data word is different from the stored word and that its difference be in a predetermined direction;

an AND gate for gating the data word stored in said temporary data store to said output;

a flip-flop connected to said AND gate for enabling said AND gate to pass said data word from said temporary data store to said output; and a resettable counter means for counting the number of input data words generated by said converting means and for enabling said gate means to control said flip-flop to output said stored data word, said resettable counter means being reset by said output control signal from said controlling means wherein said resettable counter means is reset to zero by said output control signal from said controlling means each time said control signal is outputted, said resettable counter means controlling said flip-flop to enable said AND gate whenever said resettable counter means counts the generation of a predetermined number of said input data words without being reset.

2. The system of claim 1 wherein the controlling means compares in accordance with said criterion which states that the input word must be of less value than the stored data word.

3. The system of claim 1 wherein the controlling means compares in accordance with said criterion which states that the input data word must be of greater value than the stored data word.

* * * * *